United States Patent
Riley et al.

(10) Patent No.: US 7,546,504 B2
(45) Date of Patent: Jun. 9, 2009

(54) SYSTEM AND METHOD FOR ADVANCED LOGIC BUILT-IN SELF TEST WITH SELECTION OF SCAN CHANNELS

(75) Inventors: Mack Wayne Riley, Austin, TX (US); Michael Fan Wang, Austin, TX (US)

(73) Assignee: International Business Machines Corporation, Armonk, NY (US)

(*) Notice: Subject to any disclaimer, the term of this patent is extended or adjusted under 35 U.S.C. 154(b) by 343 days.

(21) Appl. No.: 11/463,904

(22) Filed: Aug. 11, 2006

(65) Prior Publication Data

US 2008/0052579 A1 Feb. 28, 2008

(51) Int. Cl.
*G01R 31/28* (2006.01)

(52) U.S. Cl. ........................ 714/729; 714/731; 714/733; 714/728

(58) Field of Classification Search ........................ None
See application file for complete search history.

(56) References Cited

U.S. PATENT DOCUMENTS 7,155,648 B2 * 12/2006 Jas et al. ..................... 714/726

2002/0194565 A1 * 12/2002 Arabi ......................... 714/729
2007/0168809 A1 * 7/2007 Kiryu et al. ................. 714/733

* cited by examiner

*Primary Examiner*—Christine T Tu
(74) *Attorney, Agent, or Firm*—VanLeeuwen & VanLeeuwen; Matthew B. Talpis

(57) ABSTRACT

A system and method for advanced logic built-in self test with selection of scan channels is present. An LBIST controller loads scan patterns into a device's scan channels through sequential or interleaved loading techniques in order to minimize instantaneous power requirements. During interleave loading, the LBIST controller loads a scan bit into a first scan chain, then into a second scan chain, etc. until one bit is loaded into each scan chain. The LBIST controller then returns to load another scan bit into the first scan channel, then the second scan channel, etc. During sequential loading, the LBIST controller loads an entire scan pattern into a first scan chain (one bit per clock cycle). Once the first scan pattern is loaded, the LBIST controller proceeds to load subsequent scan patterns into corresponding scan chains on a one bit per scan channel per clock cycle basis.

17 Claims, 6 Drawing Sheets

300

| Channel | CYCLE | | | | | | | | | | |
|---|---|---|---|---|---|---|---|---|---|---|---|
| | 1 | 2 | 3 | 4 | 5 | 6 | 7 | 8 | ... | 4n-1 | 4n |
| A | S | H | H | H | S | H | H | H | ... | H | S |
| B | S | H | H | H | S | H | H | H | ... | H | S |
| C | S | H | H | H | S | H | H | H | ... | H | S |
| D | S | H | H | H | S | H | H | H | ... | H | S |
| Power | 100% | 0% | 0% | 0% | 100% | 0% | 0% | 0% | ... | 0% | 100% |

| Channel | CYCLE | | | | | | | | | | |
|---|---|---|---|---|---|---|---|---|---|---|---|
| | 1 | 2 | 3 | 4 | 5 | 6 | 7 | 8 | ... | 4n-1 | 4n |
| A | S | H | H | H | S | H | H | H | ... | H | H |
| B | H | S | H | H | H | S | H | H | ... | H | H |
| C | H | H | S | H | H | H | S | H | ... | S | H |
| D | H | H | H | S | H | H | H | S | ... | H | S |
| Power | 25% | 25% | 25% | 25% | 25% | 25% | 25% | 25% | ... | 25% | 25% |

| Channel | CYCLE | | | | | | | | | | |
|---|---|---|---|---|---|---|---|---|---|---|---|
| | 1 | 2 | ... | n | n+1 | n+2 | n+... | 2n | ... | 4n-1 | 4n |
| A | S | S | S | S | H | H | H | H | ... | H | H |
| B | H | H | H | H | S | S | S | S | ... | H | H |
| C | H | H | H | H | H | H | H | H | ... | H | H |
| D | H | H | H | H | H | H | H | H | ... | S | S |
| Power | 25% | 25% | 25% | 25% | 25% | 25% | 25% | 25% | ... | 25% | 25% |

FIG. 3C

SYSTEM AND METHOD FOR ADVANCED LOGIC BUILT-IN SELF TEST WITH SELECTION OF SCAN CHANNELS

BACKGROUND OF THE INVENTION

1. Technical Field

The present invention relates to a system and method for advanced logic built-in self test (LBIST) with selection of scan channels. More particularly, the present invention relates to a system and method for loading a device's scan chains through sequential or interleaved loading techniques in order to minimize instantaneous power requirements during an LBIST.

2. Description of the Related Art

Devices have used logic built-in self test (LBIST) for years in order to determine the device circuitry's integrity. To perform an LBIST, an LBIST controller loads scan patterns into scan chains and initiates one or more functional cycles, which, in turn, propagates the scan pattern values throughout the device's circuitry. Responses are then captured and logged into a multiple-input signature register (MISR). Each LBIST controller may drive a number of scan chains depending upon the number of channels the LBIST controller supports.

A challenge found during an LBIST controller's load/scan phase is that a substantial amount of latches clock simultaneously, which draws a tremendous amount of current from a device's power supply. This large current demand creates a change in current per unit time (di/dt) many times larger than what a device typically experiences during functional operation.

Existing art attempts to alleviate the LBIST controller's large di/dt demand by inserting hold or idle cycles between load/scan cycles. Meaning, if an LBIST controller supports four scan channels, the LBIST controller loads a scan bit into all four scan channels during a single clock cycle, and then waits a number of clock cycles before loading more scan bits. A challenge found with this approach, however, is that a tremendous amount of current is still required during clock cycles that the LBIST controller loads scan bits.

What is needed, therefore, is a system and method that minimizes instantaneous power requirements during an LBIST.

SUMMARY

It has been discovered that the aforementioned challenges are resolved using a system and method for loading a device's scan channels through sequential or interleaved loading techniques in order to minimize instantaneous power requirements during an LBIST. During sequential loading or interleaved loading, an LBIST controller loads scan patterns into scan chains on a scan bit per scan channel per clock cycle basis.

An LBIST controller receives an LBIST program from a system tester. The LBIST program identifies whether the LBIST controller should load scan patterns into a device's scan chains using a sequential loading technique or an interleave loading technique. During a sequential load, the LBIST controller loads a first scan pattern (one bit per clock cycle or one bit per multiple clock cycles) into a first scan chain through a first scan channel, and then proceeds to load a second scan pattern into a second scan chain through a second scan channel. In turn, the LBIST controller loads subsequent scan patterns into subsequent scan chains through subsequent scan channels on a scan bit per scan channel per clock cycle basis.

During an interleave load, the LBIST controller loads a scan bit from a first scan pattern into a first scan chain through a first scan channel. Once the scan bit loads, the LBIST controller selects a second scan pattern and loads a scan bit from the second scan pattern into a second scan chain through a second scan channel. The LBIST controller continues in this manner, loading a scan bit in each of the scan chains through their respective scan channels. After each scan chain includes a loaded scan bit, the LBIST controller returns and loads a scan bit into the first scan chain, then the second scan chain, etc. until each of the scan bits included in each of the scan patterns is loaded into their respective scan chains.

Once the scan patterns are loaded into their respective scan chains (either sequentially or interleaved), the device executes a number of functional clock cycles to clock the scan pattern values through various areas of the device's functional logic in order to determine whether the functional logic passes the built-in self test.

The foregoing is a summary and thus contains, by necessity, simplifications, generalizations, and omissions of detail; consequently, those skilled in the art will appreciate that the summary is illustrative only and is not intended to be in any way limiting. Other aspects, inventive features, and advantages of the present invention, as defined solely by the claims, will become apparent in the non-limiting detailed description set forth below.

BRIEF DESCRIPTION OF THE DRAWINGS

The present invention may be better understood, and its numerous objects, features, and advantages made apparent to those skilled in the art by referencing the accompanying drawings.

FIG. 3A is a table showing a device's fluctuating power requirements using prior art methodologies;

FIG. 3B is a table showing a device's non-fluctuating power requirements using an interleave load type for loading scan patterns into a device's scan channels;

FIG. 3C is a table showing a device's non-fluctuating power requirements using a sequential load type for loading scan patterns into a device's scan channels;

DETAILED DESCRIPTION

The following is intended to provide a detailed description of an example of the invention and should not be taken to be limiting of the invention itself. Rather, any number of variations may fall within the scope of the invention, which is defined in the claims following the description.

Figure 1:
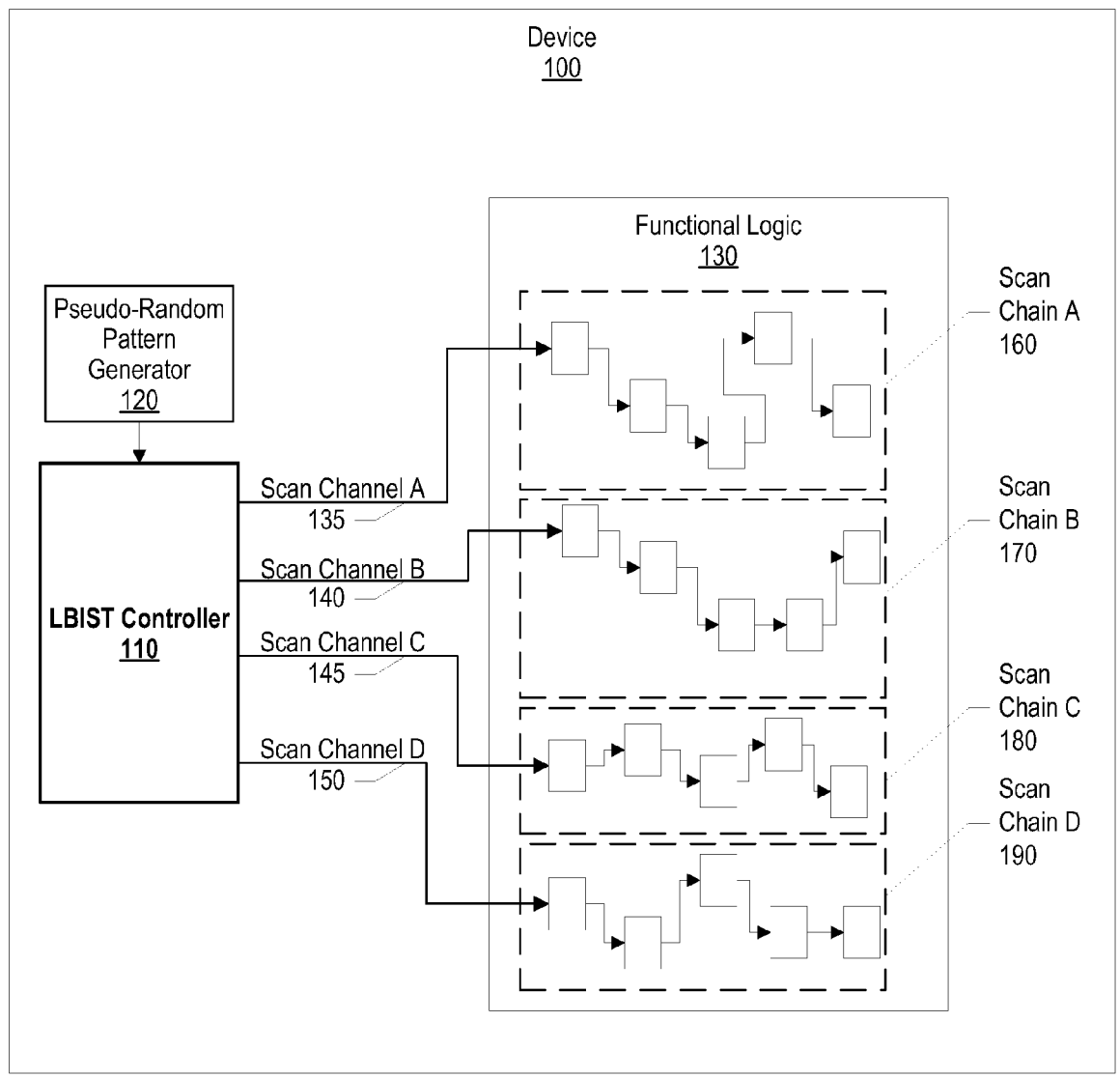
FIG. 1 is a diagram showing a device performing a logic built-in self test (LBIST)

FIG. 1 is a diagram showing a device performing a logic built-in self test (LBIST). Device 100 includes LBIST controller 110, which performs a built-in self test on functional logic 130. LBIST 110 performs the self tests using a sequential load type or an interleave load type, each of which loads scan patterns into scan chains on a scan bit per scan channel per clock cycle basis.

LBIST controller 110 receives scan patterns from pseudo-random pattern generator 120, which are pseudo-random in nature. In turn, LBIST controller 110 "pushes" (loads) scan bits from the scan patterns onto particular scan channels in order to load corresponding scan chains. Each scan chain is a chain of "latches," and LBIST controller 110 loads a scan pattern into the latches using a corresponding scan channel. FIG. 1 shows that LBIST controller 110 uses four scan channels, which are scan channel A 135, scan channel B 140, scan channel C 145, and scan channel D 150, to load four corresponding scan chains, which are scan chain A 160, scan chain B 170, scan chain C 180, and scan chain D 190, respectively.

Each of the scan chains includes a plurality of latches (e.g., two-thousand latches each) that are integrated throughout functional logic 130. During each clock cycle, LBIST controller 110 pushes one scan bit from a particular scan pattern onto a particular scan channel. The scan bit loading sequence depends upon whether LBIST controller 110 performs a sequential load type or a interleave load type. During a sequential load type, LBIST controller 110 loads a first scan pattern (one bit per clock cycle) into scan chain A 160 through scan channel A 135, and then proceeds to load a second scan pattern into scan chain B 170 through scan channel B 140. In turn, LBIST controller 110 loads a corresponding scan pattern into scan chain C 180 through scan channel C 145, and then loads a corresponding scan pattern into scan chain D 190 through scan channel D 150 (see FIG. 3C and corresponding text for further details).

During an interleave load type, LBIST controller 110 loads a scan bit from a first scan pattern into scan chain A 160 through scan channel A 135. Once loaded, LBIST controller 110 selects a second scan pattern and loads a scan bit from the second scan pattern into scan chain B 170 through scan channel B 140. Then, LBIST controller 110 selects a third scan pattern and loads a scan bit from the third scan pattern into scan chain C 180 through scan channel C 145. Lastly, LBIST controller 110 selects a fourth scan pattern and loads a scan bit from the fourth scan pattern into scan chain D 190 through scan channel D 150. After a scan bit is loaded into each of the scan chains, LBIST controller 110 continues to load scan bits into each of the scan chains (one bit per scan channel per clock cycle) until each of the scan bits included in each of the scan patterns is loaded (see FIG. 3B and corresponding text for further details).

Figure 4:
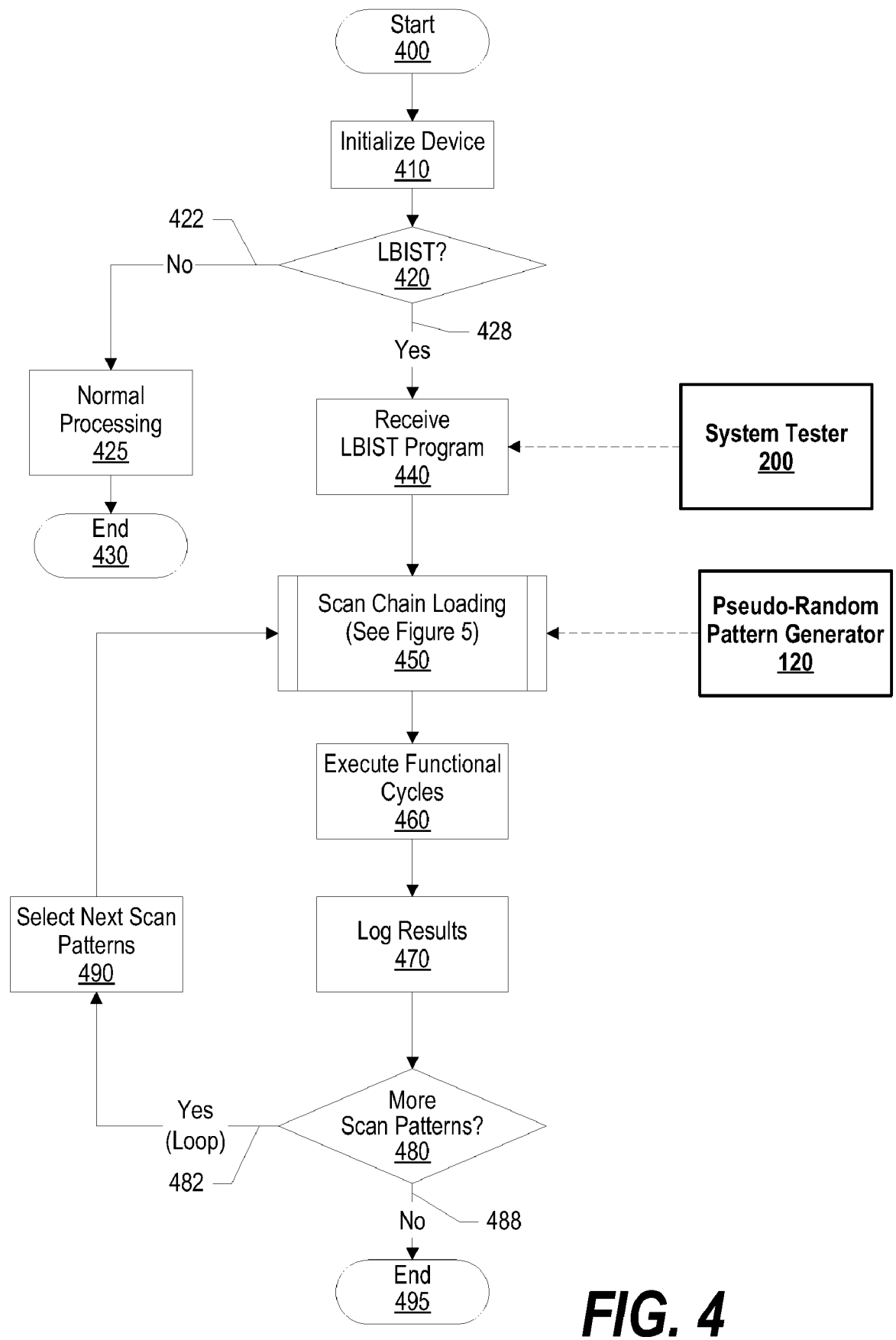
FIG. 4 is a high-level flowchart showing steps taken in performing a logic built-in self test (LBIST) within a device.

Once the scan patterns are loaded into their respective scan chains (either sequentially or interleaved), device 100 executes a number of functional clock cycles to clock the scan pattern values through various areas of functional logic 130 in order to determine whether functional logic 130 passes the built-in self test (see FIG. 4 and corresponding text for further details). As one skilled in the art can appreciate, the invention described herein may be used for more or less scan channels than what is shown in FIG. 1.

Figure 2:
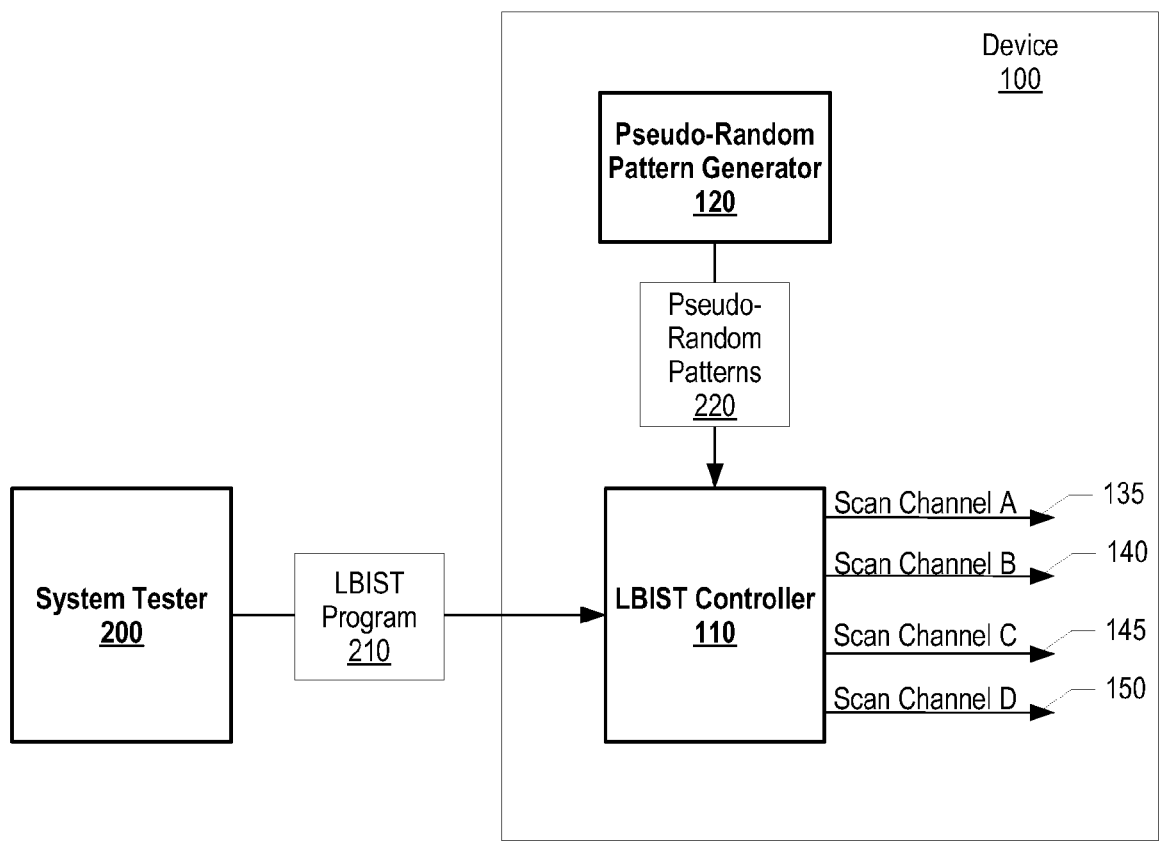
FIG. 2 is a diagram showing a device receiving a logic built-in self test (LBIST) program from a system tester and using a pseudo-random pattern generator to generate scan patterns.

FIG. 2 is a diagram showing a device receiving a logic built-in self test (LBIST) program from a system tester and using a pseudo-random pattern generator to generate scan patterns. Device 100 couples to a test system, such as through a bed of nails tester, in which system tester 200 controls which tests device 100 performs. During one test, system tester 200 instructs device 100 to perform a logic built-in self-test (LBIST). Device 100 is the same as that shown in FIG. 1.

When system tester 200 requests device 100 to perform an LBIST, system tester 200 also provides LBIST program 210 to device 100's LBIST controller 110. LBIST program 210 indicates whether LBIST controller 110 should perform a sequential load type or an interleave load type when loading device 100's scan chains. In either case, pseudo-random pattern generator 120 provides pseudo-random patterns 220 to LBIST controller 110, which LBIST controller 110 uses as scan patterns to load into device 100's scan chains through scan channels A 135, B 140, C 145, and D 150. LBIST controller 110, pseudo-random pattern generator 120, and scan channels A 135, B 140, C 145, and D 150 are the same as those shown in FIG. 1.

FIG. 3A is a table showing a device's fluctuating power requirements using prior art methodologies. Table 300 shows how existing art loads scan patterns into scan chains through scan channels. Table 300 includes rows 302 through 308, each corresponding to a scan channel. Table 300 also includes columns 310 through 328, whereby each of the columns corresponds to a particular clock cycle.

As can be seen in column 310, existing art loads a scan bit into all scan channels during a clock cycle, resulting in a large change in current (power) to the device (row 309). As such, existing art waits numerous clock cycles (columns 312-316) in order to provide sufficient time for the device's power source to recover before loading another scan bit into all channels (column 318). Once recovered, existing art repeats the process (columns 320-326) until all scan bits are loaded at 4n clock cycles (column 328), where "n" is the number of latches included in one scan chain. This process takes 4n clock cycles because the example shown in FIG. 3A includes three hold cycles per every scan cycle. As those skilled in the art will appreciate, more or less scan channels may be loaded than what is shown in FIG. 3A. For example, when an LBIST controller inserts seven hold cycles between scan cycles, the process takes 8 n clock cycles.

This prior art approach may alleviate the effects of constant large current requirements but, however, it produces large instantaneous current requirements between clock cycles (0% to 100%).

FIG. 3B is a table showing a device's non-fluctuating power requirements using an interleave load type for loading scan patterns into a device's scan channels. An interleave load type alleviates large instantaneous current requirements discussed in FIG. 3A by loading one scan bit per scan channel per clock cycle. When an LBIST controller performs an interleave load type, the LBIST controller loads a scan bit from a first scan pattern into a first scan channel, and then proceeds to load a scan bit from a second scan pattern into a second scan channel. Once each scan channel has one scan bit loaded, the LBIST controller returns to the first scan channel to load another scan bit. This proceeds until each scan pattern is loaded into its respective scan chains.

Table 330 includes rows 332 through 338, each corresponding to a scan channel. Table 330 also includes columns 340 through 358, whereby each of the columns corresponds to a particular clock cycle. As can be seen, column 340 shows that a scan bit is only loaded into channel A during a clock cycle. During the next clock cycle, column 342 shows that a scan bit is only loaded into channel B. Column 344 shows that on the next clock cycle, a scan bit is only loaded into channel C. Finally, column 346 shows that a scan bit is only loaded into channel D during the next clock cycle.

Once an LBIST controller finishes loading a scan bit in each of the scan channels, the LBIST controller returns to the first scan channel to load another scan bit (column 348). The LBIST controller proceeds to load one scan bit per scan channel per clock cycle (columns 350-356) until each of the scan bits are loaded at 4 n clock cycles (column 358), where "n" is the number of latches included in one scan chain. This process takes 4 n clock cycles because the example shown in FIG. 3B includes four scan channels (Channels A-D). As those skilled in the art will appreciate, more or less scan channels may be loaded than what is shown in FIG. 3B. For example, when an LBIST controller loads five scan channels, the process takes 5n clock cycles.

As can be seen in row 339, since the LBIST controller loads one scan bit per clock cycle, the device's power requirement is nearly constant and is reduced to 25%. In one embodiment that includes more scan chains, the average power per clock cycle is (1/m)×100%, where m is the number of scan chains. For example, assuming a system includes ten scan chains, the resultant power per cycle is 10% and takes 10 n clock cycles to load each of the scan chains, where "n" is the number of latches included in one scan chain.

In another embodiment, the system may simultaneously load multiple scan chains in order to reduce the time required to load all of the scan chains. For example, the system may load two scan chains at a time in order to reduce the amount of time to load all of the scan chains by 50%.

FIG. 3C is a table showing a device's non-fluctuating power requirements using a sequential load type for loading scan patterns into a device's scan channels. A sequential load type alleviates large instantaneous current requirements discussed in FIG. 3A by loading one scan bit per scan channel per clock cycle. When an LBIST controller performs a sequential load type, the LBIST controller loads a first scan pattern into a first scan chain (one bit per clock cycle). Once the first scan pattern is loaded, the LBIST controller proceeds to load subsequent scan patterns into corresponding scan chains on a one bit per scan channel per clock cycle basis.

Table 360 includes rows 362 through 368, each corresponding to a scan channel. Table 360 also includes columns 370 through 388, whereby each of the columns corresponds to a particular clock cycle. As can be seen in columns 370 through 376, an LBIST controller loads scan bits (one scan bit per clock cycle) only into channel A until channel A's corresponding scan pattern is completely loaded. This process takes "n" clock cycles, where n is the number of latches that are included in one scan chain.

Next, columns 378-384 show that the LBIST controller loads scan bits (one scan bit per clock cycle) only into channel B until channel B's corresponding scan pattern is completely loaded. Once channel B's scan pattern is completely loaded (column 384), the LBIST controller loads channel C's scan pattern and then channel D's scan pattern (column 386) until each of the scan bits are loaded at 4n clock cycles (column 388), where "n" is the number of latches included in one scan chain. Again, this process takes 4 n clock cycles because the example shown in FIG. 3C includes four scan channels (Channels A-D). As those skilled in the art will appreciate, more or less scan channels may be loaded than what is shown in FIG. 3C. For example, when an LBIST controller loads five scan channels, the process takes 5 n clock cycles.

As can be seen in row 369, since the LBIST controller loads one scan bit per clock cycle, the device's power requirement is nearly constant and is reduced to 25%. As discussed above, in one embodiment that includes more scan chains, the average power per clock cycle is (1/m)×100%, where m is the number of scan chains. Also as discussed above, the system may simultaneously load multiple scan chains in order to reduce the time required to load all of the scan chains.

FIG. 4 is a high-level flowchart showing steps taken in performing a logic built-in self test (LBIST) within a device.

Processing commences at 400, whereupon processing initializes the device at step 410. A determination is made as to whether to perform an LBIST or continue on with normal processing functions (decision 420). For example, the device may be connected to a system tester, whereby the system tester pulls an input/output pin low in order to instruct processing to perform an LBIST. If processing should perform normal processing functions, decision 420 branches to "No" branch 422 whereupon processing performs normal processing functions (step 425), and ends at 430.

On the other hand, if processing should perform an LBIST, decision 420 branches to "Yes" branch 428 whereupon processing receives an LBIST program from system tester 200 at step 440. The LBIST program includes information as to whether to perform a sequential load type LBIST or a interleave load type LBIST (see FIGS. 3B, 3C, and corresponding text for further details). System tester 200 is the same as that shown in FIG. 2.

Figure 5:
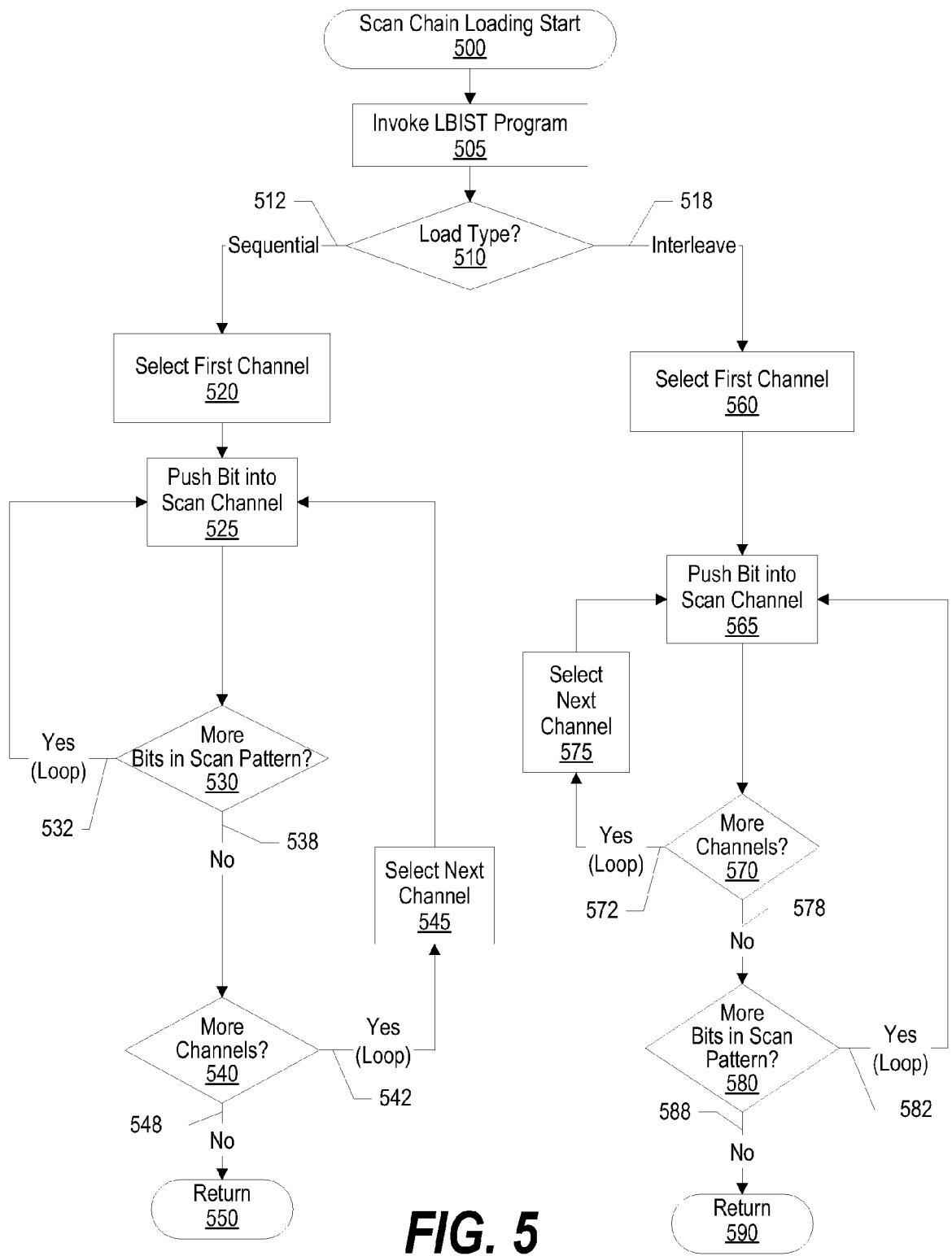
FIG. 5 is a detail flowchart showing steps taken in loading scan chains using either a sequential load type or an interleave load type.

The LBIST controller loads pseudo-random scan patterns into the device's scan channels using either a sequential load type approach or an interleave load type approach (pre-defined processing block 450, see FIG. 5 and corresponding text for further details). Once each scan pattern is loaded, the LBIST controller executes a particular number of functional cycles in order to exercise the device's circuitry (step 460). The LBIST controller then logs resulting latch values in a multiple-input signature register (MISR) at step 470.

A determination is made as to whether there are more scan patterns to load into the device's scan channels (decision 480). If there are more scan patterns to load, decision 480 branches to "Yes" branch 482, which loops back to select (step 490) and process more scan patterns. This looping continues until there are no more scan patterns to process, at which point decision 480 branches to "No" branch 488 whereupon processing ends at 495.

FIG. 5 is a detail flowchart showing steps taken in loading scan chains using either a sequential load type or an interleave load type. Processing commences at 500, whereupon processing invokes a logic built-in self test (LBIST) program it received from a system tester (step 505) (see FIG. 4 and corresponding text for further details).

A determination is made whether the LBIST program indicates a sequential load type or an interleave load type to load scan bits into a device's scan chains (decision 510). A sequential load type loads an entire first scan pattern into a first scan chain, and then proceeds to load an entire second scan pattern into a second scan chain. An interleave load type loads a scan bit from a first scan pattern into a first scan chain, and then proceeds to load a scan bit from a second pattern into a second scan chain (see FIGS. 3B, 3C, and corresponding text for further details).

If the LBIST program indicates a sequential load type, decision 510 branches to "Sequential" branch 512 whereupon processing selects a first scan channel at step 520. At step 525, processing "pushes" (loads) a scan bit from a first scan pattern into the first scan channel, which loads into a corresponding scan chain.

A determination is made as to whether there are more scan bits to load from the first scan pattern (decision 530). If there are more scan bits to load from the first scan pattern, decision 530 branches to "Yes" branch 532, which loops back to continue to load scan bits from the first scan pattern into the first scan channel. This looping continues until the first scan pattern is loaded into the first scan chain through the first scan channel, at which point decision 530 branches to "No" branch 538.

A determination is made as to whether there are more scan channels to load (decision 540). For example, a device may have four scan channels that load four different scan chains. If there are more scan channels to load, decision 540 branches to "Yes" branch 542 which loops back to select (step 545) and load the next scan channel using a corresponding scan pattern. This looping continues until there are no more scan chains to load, at which point decision 540 branches to "No" branch 548 whereupon processing returns at 550.

When the LBIST program indicates an interleave load type, decision 510 branches to "Interleave" branch 518 whereupon processing selects a first scan channel at step 560. At step 565, processing "pushes" a scan bit from a first scan pattern into the first scan channel, which loads into a corresponding scan chain.

A determination is made as to whether there are more scan chains to load a scan bit from a corresponding scan pattern (decision 570). If there are more scan chains to load, decision 570 branches to "Yes" branch 572, which loops back to select the next scan channel (step 575) and load a scan bit from its corresponding scan pattern into the selected scan channel. This looping continues until there are no more scan chains to load a scan bit (e.g., each scan chain includes one scan bit), at which point decision 570 branches to "No" branch 578.

A determination is made as to whether there are more scan bits to load into the scan channels (decision 580). If there are more scan bits to load into the scan channels, decision 580 branches to "Yes" branch 582, which loops back to continue to load a second round of scan bits into the scan channels from their corresponding scan patterns. This looping continues until each of the scan bits from each of the scan patterns is loaded into their respective scan chains, at which point decision 580 branches to "No" branch 588, and returns at 590.

Figure 6:
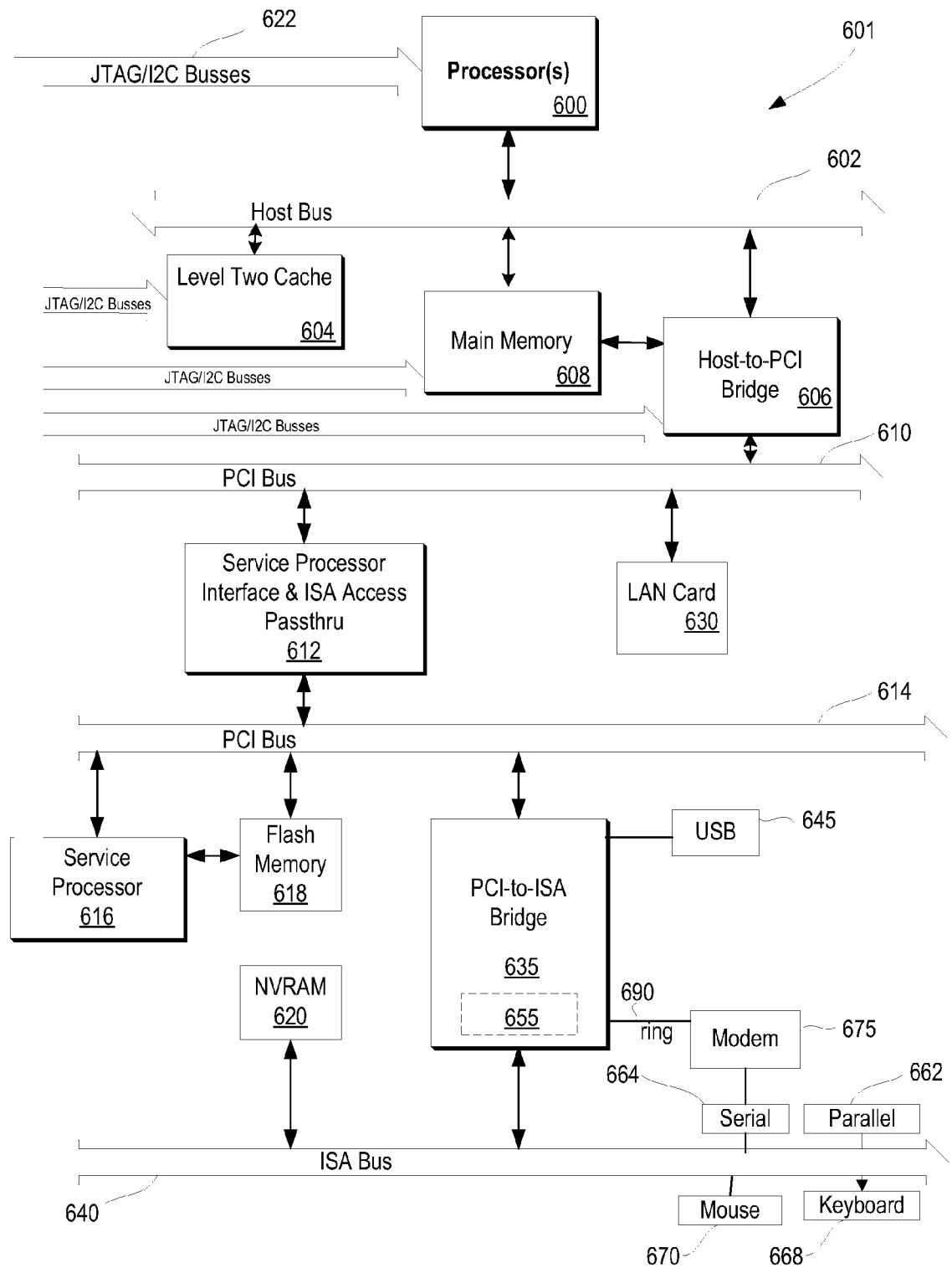
FIG. 6 is a block diagram of a computing device capable of implementing the present invention.

FIG. 6 illustrates information handling system 601 which is a simplified example of a computer system capable of performing the computing operations described herein. Computer system 601 includes processor 600 which is coupled to host bus 602. A level two (L2) cache memory 604 is also coupled to host bus 602. Host-to-PCI bridge 606 is coupled to main memory 608, includes cache memory and main memory control functions, and provides bus control to handle transfers among PCI bus 610, processor 600, L2 cache 604, main memory 608, and host bus 602. Main memory 608 is coupled to Host-to-PCI bridge 606 as well as host bus 602. Devices used solely by host processor(s) 600, such as LAN card 630, are coupled to PCI bus 610. Service Processor Interface and ISA Access Pass-through 612 provides an interface between PCI bus 610 and PCI bus 614. In this manner, PCI bus 614 is insulated from PCI bus 610. Devices, such as flash memory 618, are coupled to PCI bus 614. In one implementation, flash memory 618 includes BIOS code that incorporates the necessary processor executable code for a variety of low-level system functions and system boot functions.

PCI bus 614 provides an interface for a variety of devices that are shared by host processor(s) 600 and Service Processor 616 including, for example, flash memory 618. PCI-to-ISA bridge 635 provides bus control to handle transfers between PCI bus 614 and ISA bus 640, universal serial bus (USB) functionality 645, power management functionality 655, and can include other functional elements not shown, such as a real-time clock (RTC), DMA control, interrupt support, and system management bus support. Nonvolatile RAM 620 is attached to ISA Bus 640. Service Processor 616 includes JTAG and I2C busses 622 for communication with processor(s) 600 during initialization steps. JTAG/I2C busses 622 are also coupled to L2 cache 604, Host-to-PCI bridge 606, and main memory 608 providing a communications path between the processor, the Service Processor, the L2 cache, the Host-to-PCI bridge, and the main memory. Service Processor 616 also has access to system power resources for powering down information handling device 601.

Peripheral devices and input/output (I/O) devices can be attached to various interfaces (e.g., parallel interface 662, serial interface 664, keyboard interface 668, and mouse interface 670 coupled to ISA bus 640. Alternatively, many I/O devices can be accommodated by a super I/O controller (not shown) attached to ISA bus 640.

In order to attach computer system 601 to another computer system to copy files over a network, LAN card 630 is coupled to PCI bus 610. Similarly, to connect computer system 601 to an ISP to connect to the Internet using a telephone line connection, modem 665 is connected to serial port 664 and PCI-to-ISA Bridge 635.

While FIG. 6 shows one information handling system that employs processor(s) 600, the information handling system may take many forms. For example, information handling system 601 may take the form of a desktop, server, portable, laptop, notebook, or other form factor computer or data processing system. Information handling system 601 may also take other form factors such as a personal digital assistant (PDA), a gaming device, ATM machine, a portable telephone device, a communication device or other devices that include a processor and memory.

One of the preferred implementations of the invention is a client application, namely, a set of instructions (program code) in a code module that may, for example, be resident in the random access memory of the computer. Until required by the computer, the set of instructions may be stored in another computer memory, for example, in a hard disk drive, or in a removable memory such as an optical disk (for eventual use in a CD ROM) or floppy disk (for eventual use in a floppy disk drive), or downloaded via the Internet or other computer network. Thus, the present invention may be implemented as a computer program product for use in a computer. In addition, although the various methods described are conveniently implemented in a general purpose computer selectively activated or reconfigured by software, one of ordinary skill in the art would also recognize that such methods may be carried out in hardware, in firmware, or in more specialized apparatus constructed to perform the required method steps.

While particular embodiments of the present invention have been shown and described, it will be obvious to those skilled in the art that, based upon the teachings herein, that changes and modifications may be made without departing from this invention and its broader aspects. Therefore, the appended claims are to encompass within their scope all such changes and modifications as are within the true spirit and scope of this invention. Furthermore, it is to be understood that the invention is solely defined by the appended claims. It will be understood by those with skill in the art that if a specific number of an introduced claim element is intended, such intent will be explicitly recited in the claim, and in the absence of such recitation no such limitation is present. For non-limiting example, as an aid to understanding, the following appended claims contain usage of the introductory phrases "at least one" and "one or more" to introduce claim elements. However, the use of such phrases should not be construed to imply that the introduction of a claim element by the indefinite articles "a" or "an" limits any particular claim containing such introduced claim element to inventions containing only one such element, even when the same claim includes the introductory phrases "one or more" or "at least one" and indefinite articles such as "a" or "an"; the same holds true for the use in the claims of definite articles.

What is claimed is:

1. A computer-implemented method comprising:

selecting only a first scan channel from a plurality of scan channels, wherein each of the plurality of scan channels correspond to one of a plurality of scan chains included in a device, the first scan channel corresponding to a first scan chain included in the plurality of scan chains;

loading, on a first clock cycle, a scan bit from a first scan pattern into the selected first scan channel;

after the loading of the scan bit, selecting only a second scan channel from the plurality of scan channels, wherein the second scan channel corresponds to a second scan chain included in the plurality of scan chains;

loading, on a second clock cycle that is immediately after the first clock cycle, a scan bit from a second scan pattern into the second scan channel; and continuing to load, after the loading of the scan bit from the second scan pattern, subsequent scan bits from subsequent scan patterns into subsequent scan channels during subsequent clock cycles until each of the plurality of scan channels includes one scan bit.

2. The method of claim 1 wherein the loading corresponds to a sequential load type, the method further comprising:

after the loading of the first bit, loading another scan bit from the first scan pattern during one of the subsequent clock cycles into the first scan channel; and continuing to load subsequent scan bits from the first scan pattern only into the first scan channel during the subsequent clock cycles until the first scan pattern is completely loaded.

3. The method of claim 2 further comprising:

after the first scan pattern is completely loaded, selecting the second scan channel from the plurality of scan channels, wherein the second scan channel corresponds to the second scan chain included in the plurality of scan chains;

loading the scan bit from the second scan pattern only into the second scan channel; and continuing to load, after the loading of the scan bit from the second scan pattern, subsequent scan bits from the second scan pattern only into the second scan channel during the subsequent clock cycles until the second scan pattern is completely loaded.

4. The method of claim 1, further comprising:

after each of the plurality of scan channels includes one scan bit, loading another scan bit from the first scan pattern into the first scan channel.

5. The method of claim 1 wherein the first scan pattern is a pseudo-random pattern that is generated by a pseudo-random pattern generator.

6. The method of claim 1 further comprising:

invoking a logic built-in self test;

in response to the invoking, receiving a logic built-in self test program from a system tester; and executing the logic built-in self test program, which results in the selecting and the loading.

7. A computer program product stored on a computer operable media, the computer operable media containing instructions for execution by a computer, which, when executed by the computer, cause the computer to implement a method for a logic built in self test, the method comprising:

selecting only a first scan channel from a plurality of scan channels, wherein each of the plurality of scan channels correspond to one of a plurality of scan chains included in a device, the first scan channel corresponding to a first scan chain included in the plurality of scan chains;

loading, on a first clock cycle, a scan bit from a first scan pattern into the selected first scan channel;

after the loading of the scan bit, selecting only a second scan channel from the plurality of scan channels, wherein the second scan channel corresponds to a second scan chain included in the plurality of scan chains;

loading, on a second clock cycle that is immediately after the first clock cycle, a scan bit from a second scan pattern into the second scan channel; and continuing to load, after the loading of the scan bit from the second scan pattern, subsequent scan bits from subsequent scan patterns into subsequent scan channels during subsequent clock cycles until each of the plurality of scan channels includes one scan bit.

8. The computer program product of claim 7 wherein the loading corresponds to a sequential load type, the method further comprising:

after the loading of the first bit, loading another scan bit from the first scan pattern during one of the subsequent clock cycles, into the first scan channel; and continuing to load subsequent scan bits from the first scan pattern only into the first scan channel during subsequent clock cycles until the first scan pattern is completely loaded.

9. The computer program product of claim 8 wherein the method further comprises:

after the first scan pattern is completely loaded, selecting the second scan channel from the plurality of scan channels, wherein the second scan channel corresponds to the second scan chain included in the plurality of scan chains;

loading the scan bit from the second scan pattern only into the second scan channel; and continuing to load, after the loading of the scan bit from the second scan pattern, subsequent scan bits from the second scan pattern only into the second scan channel during the subsequent clock cycles until the second scan pattern is completely loaded.

10. The computer program product of claim 7 wherein the method further comprises:

after each of the plurality of scan channels includes one scan bit, loading another scan bit from the first scan pattern into the first scan channel.

11. The computer program product of claim 7 wherein the first scan pattern is a pseudo-random pattern that is generated by a pseudo-random pattern generator.

12. The computer program product of claim 7 further comprising:

invoking a logic built-in self test;

in response to the invoking, receiving a logic built-in self test program from a system tester; and executing the logic built-in self test program, which results in the selecting and the loading.

13. An information handling system comprising:

one or more processors;

a memory accessible by the processors;

one or more nonvolatile storage devices accessible by the processors; and a logic built-in self test tool for performing a logic built-in self test, the logic built-in self test tool being effective to:

select only a first scan channel from a plurality of scan channels, wherein each of the plurality of scan channels correspond to one of a plurality of scan chains included in one of the processors, the first scan channel corresponding to a first scan chain included in the plurality of scan chains;

load, on a first clock cycle, a scan bit from a first scan pattern into the selected first scan channel;

after the loading of the scan bit, select only a second scan channel from the plurality of scan channels, wherein the second scan channel corresponds to a second scan chain included in the plurality of scan chains;

load, on a second clock cycle that is immediately after the first clock cycle, a scan bit from a second scan pattern into the second scan channel; and continuing to load, after the loading of the scan bit from the second scan pattern, subsequent scan bits from subsequent scan patterns into subsequent scan channels during subsequent clock cycles until each of the plurality of scan channels includes one scan bit.

14. The information handling system of claim 13 wherein the loading corresponds to a sequential load type, the logic built-in self test tool further effective to:

after the loading of the first bit, load another scan bit from the first scan pattern during one of the subsequent clock cycles into the first scan channel; and continue to load subsequent scan bits from the first scan pattern only into the first scan channel during the subsequent clock cycles until the first scan pattern is completely loaded.

15. The information handling system of claim 14 wherein the logic built-in self test tool is further effective to:

after the first scan pattern is completely loaded, select the second scan channel from the plurality of scan channels, wherein the second scan channel corresponds to the second scan chain included in the plurality of scan chains;

load the scan bit from the second scan pattern only into the second scan channel; and continue to load, after the loading of the scan bit from the second scan pattern, subsequent scan bits from the second scan pattern only into the second scan channel during the subsequent clock cycles until the second scan pattern is completely loaded.

16. The information handling system of claim 13 wherein the logic built-in self test tool is further effective to:

after each of the plurality of scan channels includes one scan bit, load another scan bit from the first scan pattern into the first scan channel.

17. The information handling system of claim 13 wherein the first scan pattern is a pseudo-random pattern that is generated by a pseudo-random pattern generator.

* * * * *